(12) United States Patent
Graninger et al.

(10) Patent No.: US 12,494,777 B2
(45) Date of Patent: Dec. 9, 2025

(54) JOSEPHSON MICROWAVE SWITCH WITH A SINGLE SELECT LINE

(71) Applicant: NORTHROP GRUMMAN SYSTEMS CORPORATION, Falls Church, VA (US)

(72) Inventors: Aurelius L. Graninger, Sykesville, MD (US); Aaron A. Pesetski, Gambrills, MD (US); Robert E. Zimmerman, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 173 days.

(21) Appl. No.: 18/447,001

(22) Filed: Aug. 9, 2023

(65) Prior Publication Data

US 2025/0055452 A1    Feb. 13, 2025

(51) Int. Cl.
*H03K 17/12* (2006.01)
*H03K 17/00* (2006.01)

(52) U.S. Cl.
CPC .......... *H03K 17/12* (2013.01); *H03K 17/007* (2013.01)

(58) Field of Classification Search
CPC .............................. H03K 17/007; H03K 17/12
USPC ......................................................... 327/528
See application file for complete search history.

(56) References Cited

U.S. PATENT DOCUMENTS

| | | | |
|---|---|---|---|
| 8,611,974 B2* | 12/2013 | Maibaum | H03K 17/92 365/162 |
| 9,928,948 B2* | 3/2018 | Naaman | H01F 6/06 |
| 10,749,096 B2* | 8/2020 | Przybysz | G06N 10/40 |
| 11,874,344 B2* | 1/2024 | Swenson | G01R 33/0094 |
| 2019/0214971 A1 | 7/2019 | Keane | |
| 2023/0019017 A1 | 1/2023 | Graninger et al. | |

(Continued)

FOREIGN PATENT DOCUMENTS

WO    2019-222514 A1    11/2019

OTHER PUBLICATIONS

Graninger, et al.: "Superconducting on-chip solenoid for Josephson junction characterization"; Appl. Phys. Lett. 115, 032601 (2019); doi: 10.1063/1.5110170.

(Continued)

*Primary Examiner* — Menatoallah Youssef
*Assistant Examiner* — Colleen J O Toole
(74) *Attorney, Agent, or Firm* — Tarolli, Sundheim, Covell & Tummino LLP

(57) ABSTRACT

A superconducting switch system includes a plurality of switch network circuits, each switch network circuit having a respective Josephson junction (JJ) coupled to a respective transmission line. The superconducting switch system furthermore includes a bias line coupled to each of the respective JJs such that a mutual inductive coupling between the bias line and the respective JJ of at least two switch network circuits of the plurality of switch network circuits are different from one another. A bias line current to the bias line controls the passing or blocking of a received input signal to an output for each of the plurality of switch network circuits by controlling an impedance of the respective JJ of each of the plurality of switch network circuits, the impedance of the respective JJ being determined based on the bias line current and the mutual inductive coupling between the bias line and the respective JJ.

20 Claims, 5 Drawing Sheets

(56) References Cited

U.S. PATENT DOCUMENTS

2023/0128586 A1    4/2023    Graninger
2023/0204691 A1    6/2023    Swenson et al.

OTHER PUBLICATIONS

Borodulin, et al.: "Operation of a Latching, Low-Loss, Wideband Microwave Phase-Change Switch Below 1 K"; Journal of Low Temperature Physics (2019) 194:273-284 https://doi.org/10.1007/s10909-018-2096-8.

Naaman, et al.: "On-chip Josephson junction microwave switch"; Appl. Phys. Lett. 108, 112601 (2016); https://doi.org/10.1063/1.4943602 Submitted: Dec. 7, 2015 . Accepted: Jan. 21, 2016 . Published Online: Mar. 14, 2016.

WOISR (Notification of Transmittal of the International Search Report and the Written Opinion of the International Searching Authority) mailed Oct. 30, 2024 for corresponding PCT/US2024-037079.

\* cited by examiner

JOSEPHSON MICROWAVE SWITCH WITH A SINGLE SELECT LINE

GOVERNMENT INTEREST

The invention was made under Government Contract. Therefore, the US Government has rights to the invention as specified in that contract.

TECHNICAL FIELD

The present invention relates generally to superconducting circuits, and more particularly to a Josephson junction microwave switch with a single select line.

BACKGROUND

Conventional microwave mechanical, electro-mechanical, and electronic switches may not be compatible with on-chip integration and cryogenic operation of superconducting electronic circuits, because of incompatible fabrication processes and high power dissipation. Likewise, tunable filters that are commonly realized by use of either active components such as voltage-variable capacitors, varactors, mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high-temperature and low-temperature superconductors, their use in switching applications suffered from one or more of high return loss, limited usable bandwidth, and poor out-of-band off-state isolation.

SUMMARY

In one example, a superconducting switch system includes a plurality of switch network circuits each having a respective Josephson junction (JJ) coupled to a respective transmission line. Furthermore, the superconducting switch system includes a bias line coupled to the respective JJ of each switch network circuit of the plurality of switch network circuits, such that a mutual inductive coupling between the bias line and the respective JJ of at least two switch network circuits of the plurality of switch network circuits are different from one another. A bias line current to the bias line controls the passing or blocking of a received input signal to an output for each of the plurality of switch network circuits by controlling an impedance of the respective JJ of each switch network circuit of the plurality of switch network circuits. The impedance of the respective JJ of each switch network circuit of the plurality of switch network circuits is determined based on the bias line current and the mutual inductive coupling between the bias line and the respective JJ.

In another example, a superconducting switch system includes a first switch network circuit having a first Josephson junction (JJ) coupled to a first transmission line having a first transmission line impedance and a second switch network circuit having a second JJ coupled to a second transmission line having a second transmission line impedance. The superconducting switch system furthermore includes a bias line coupled to first JJ and the second JJ, such that a first mutual inductive coupling between the bias line and the first JJ is different from a second mutual inductive coupling between the bias line and the second JJ. In addition, the superconducting switch system includes a bias line controller configured to provide a bias line current to the bias line to control the passing of a received input signal to outputs of the first switch network circuit and the second switch network circuit based on controlling an impedance of the first JJ and an impedance of the second JJ. The impedance of the first JJ is determined based on the bias line current and the first mutual inductive coupling, and the impedance of the second JJ is determined based on the bias line current and the second mutual inductive coupling.

DETAILED DESCRIPTION

Figure 1:
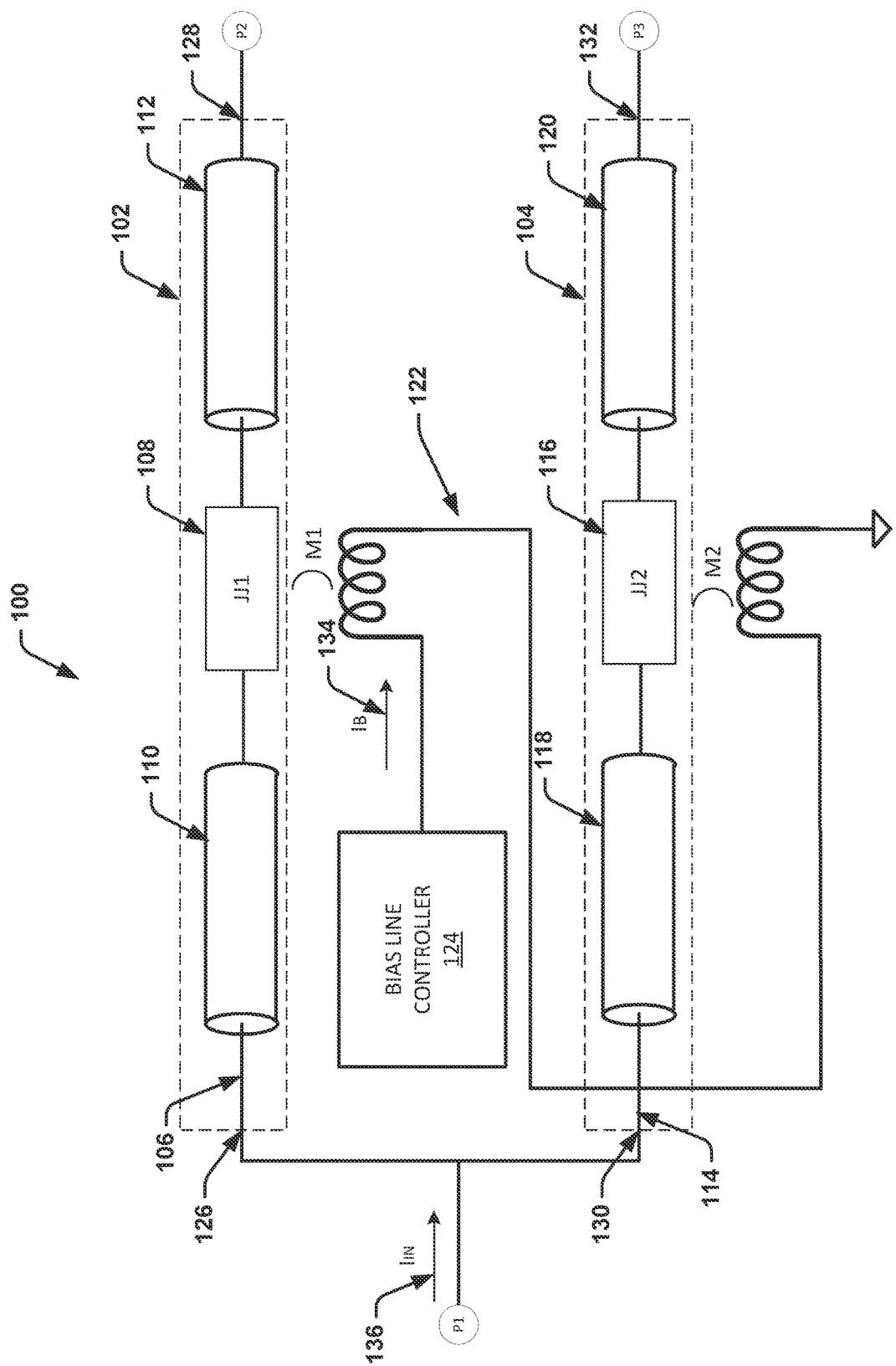
FIG. 1 illustrates a schematic block diagram of a superconducting switch system 100.

The present disclosure relates generally to superconducting circuits, and more particularly to a superconducting switch system with a single bias line/select line. The superconducting switch system provides an on-chip microwave switch to facilitate the routing of RF and microwave signals across superconducting integrated circuits. The switch system is composed of standard superconducting materials and devices, and so eliminates the need for both external switching electronics and additional fabrication process complexity. The switch system leverages the tunable impedance provided by a Josephson junction (JJ) whose critical current can be modulated by the locally-generated magnetic field from an on chip bias line. The switch system can be implemented to have a single pole, multi-throw functionality. In one example, the switch within the switch system is a JJ coupled to a suitable bias line, that when current-biased will generate a localized magnetic field oriented in the plane of the JJ.

With no current bias, the magnitude of the impedance of the JJ (sometimes also referred to herein as a junction) at a frequency ω is well approximated by $|Zj|=\omega^*Lj=\omega^*\phi_0/2\pi^*Ic$, where Lj is the Josephson inductance, $\phi_0$ is the magnetic flux quantum, ω is the frequency of an received input signal and Ic is the critical current of the JJ. In this case, the effective impedance of the junction is much lower than most transmission line impedances and the junction effectively behaves like a short circuit. A typical transmission line impedance is from about 20 ohms to about 75 ohms (e.g., 50 ohms). But at a current bias sufficient to suppress the critical current of the junction, the impedance is given by the parallel combination of the internal junction resistance and the junction capacitance. For low enough frequencies, the impedance of the internal junction resistance dominates and is larger in magnitude than most transmission line impedances (the Josephson junction internal resistance when the critical current is suppressed is given by the sub-gap resistance, with some example values being on the order 100 to 1000 ohms or more). This provides a Josephson junction with a current-tunable impedance Zj.

In a variety of superconducting electronics applications, it is desirable to insert an input signal (e.g., a microwave signal or a dc signal) into a test apparatus which is routed to one of many loads on a chip by way of a switch matrix. The switching system described herein facilitates the routing of an input signal to one of N output paths by toggling the JJ (more specifically, by changing the impedance of the JJ) in the respective output path. In a traditional switch architecture in which an input signal is routed to one of N output paths, each output path (or the corresponding JJ) is toggled by an individual bias line for that corresponding path. Requiring individual bias lines leads to increased cabling requirements which consumes valuable space in the cryogenic apparatus and limits the amount of usable I/O control lines for other purposes. Individual bias lines also requires that chip packaging must be designed to include all of these bias lines.

In order to overcome the above disadvantages, this superconducting switch system provides a microwave switch architecture that can be integrated on chip that allows routing the input signal to one of many loads on a chip by way of a switch matrix, but does so without requiring N separate control lines for a switch that has N outputs. In particular, the superconducting switch system described herein uses a single bias line/select line that has different magnitudes of mutual inductive coupling to different JJs, such that different output ports can be toggled not by biasing a different bias line, but rather by toggling the same bias line but with different bias line current values. Designing the bias line to have different mutual inductive coupling for different JJs allows the different JJs to have different impedances for a same bias line current applied to the bias line. Using a single bias line as proposed herein reduces the test stand and packaging input/output (I/O) requirements and routing requirements. Furthermore, using the single bias line allows for more physical space in the test apparatus, which enables more chips to be tested at once. Furthermore, wide-band performance of the superconducting switch system eliminates the need for separately designed switches for signals at various frequencies.

FIG. 1 illustrates a schematic block diagram of a superconducting switch system 100. The superconducting switch system 100 includes a plurality of switch network circuits. In this example, the superconducting switch system 100 is shown to include only two switch network circuits, that is, the first switch network circuit 102 and the second switch network circuit 104 for ease of reference. However, in other examples, the superconducting switch system 100 can include more than two switch network circuits. Each switch network circuit of the plurality of switch network circuits has a respective Josephson junction (JJ) coupled to a respective transmission line having a transmission line impedance. In particular, in this example, the first switch network circuit 102 includes a first JJ, that is, JJ1 108 coupled to a first transmission line 106 having a first transmission line impedance and the second switch network circuit 104 includes a second JJ, that is, JJ2 116 coupled to a second transmission line 114 having a second transmission line impedance.

The respective transmission line of each switch network circuit of the plurality of switch network circuits has a first transmission line portion coupled to an input of the respective switch network circuit and a second transmission line portion coupled to an output of the respective switch network circuit. Furthermore, the respective JJ of each switch network circuit is coupled to the first transmission line portion at an end opposite the input and the second transmission line portion at an end opposite the output. In particular, in this example, the first transmission line 106 includes a first transmission line portion 110 coupled to an input 126 of the first switch network circuit 102 and a second transmission line portion 112 coupled to an output 128 of the first switch network circuit 102. Furthermore, the JJ1 108 is coupled to the first transmission line portion 110 at an end opposite to the input 126 and the second transmission line portion 112 at an end opposite to the output 128. Similarly, the second transmission line 114 includes a first transmission line portion 118 coupled to an input 130 of the second switch network circuit 104 and a second transmission line portion 120 coupled to an output 132 of the second switch network circuit 104. Furthermore, the JJ2 116 is coupled to the first transmission line portion 118 at an end opposite to the input 130 and the second transmission line portion 120 at an end opposite to the output 132.

In some examples, an input of each switch network circuit of the plurality of switch network circuits are connected to a same input port and an output of each switch network circuit of the plurality of switch network circuits are coupled to a respective dedicated output port. For example, the input 126 of the first switch network circuit 102 and the input 130 of the second switch network circuit 104 are coupled to a same input port P1. Furthermore, the output 128 of the first switch network circuit 102 and the output 132 of the second switch network circuit 104 are coupled respectively to dedicated output ports P2 and P3. Alternately, in other examples, the input of each switch network circuit of the plurality of switch network circuits may be coupled to a respective dedicated input port and the output of each switch network circuit of the plurality of switch network circuits may be connected to a same output port.

The superconducting switch system 100 can be implemented in a parallel switch network configuration or a series switch network configuration. In the parallel switch network configuration, each switch network circuit of the plurality of switch network circuits includes a parallel switch network circuit having the respective JJ coupled to an intermediate point in a respective transmission line at a first end and to ground at a second end, as can be furthermore appreciated in FIG. 4 below. The intermediate point includes a point where the first transmission line portion and the second transmission line portion intersect. In the series switch network configuration, each switch network circuit of the plurality of switch network circuits comprises a series switch network circuit having a first end of the respective JJ coupled to the first transmission line portion of the respective transmission line at the end opposite to the input and a second end of the respective JJ coupled to the second transmission line portion of the respective transmission line at the end opposite to the output, as can be fully appreciated in FIG. 5 below.

The superconducting switch system 100 furthermore includes a bias line 122 coupled (e.g., inductively coupled) to the respective JJ of each switch network circuit of the plurality of switch network circuits. In particular, in this example, the bias line 122 is coupled to the JJ1 108 of the first switch network circuit 102 and the JJ2 116 of the second switch network circuit 104. The bias line 122 is coupled to the respective JJ of each switch network circuit of the plurality of switch network circuits, such that a mutual inductive coupling between the bias line 122 and the respective JJ of at least two switch network circuits (i.e., the JJ1 108 and the JJ2 116 in this example) of the plurality of switch network circuits are different from one another. In other examples, the bias line 122 may be coupled to the respective JJ of each of the plurality of switch network circuits, such that a mutual inductive coupling between the bias line 122 and the respective JJ of each switch network circuit of the plurality of switch network circuits are different from one another. In this example, the mutual inductive coupling between the bias line 122 and JJ1 108 is M1 and the mutual inductive coupling between the bias line 122 and the JJ2 116 is M2, where M1 is different from M2 (i.e., M1/M2≠1).

In some examples, the magnitude of the mutual inductive coupling between the bias line 122 and a respective JJ, for example, the JJ1 108, is determined by an arrangement of the bias line 122 relative to the respective JJ. In particular, the mutual inductive coupling M1 between the bias line 122 and the JJ1 108 may be determined by one or more of the following parameters, in particular: the distance or the proximity of the bias line 122 relative to the JJ1 108, whether the bias line 122 is routed above and below the JJ1 108 or whether the bias line 122 is routed only above the JJ1 108 or whether the bias line 122 is routed only below the JJ1 108, the relative length of the bias line 122 along the JJ1 108, and the number of loops of the bias line 122 that are wound around the JJ1 108. Alternately, in other examples, the magnitude of the mutual inductive coupling between the bias line 122 and a respective JJ, for example, the JJ1 108, is determined by structural feature of the respective JJ. In particular, the shape and arrangement of the respective JJ may be varied to achieve a particular mutual inductive coupling of, say, M1 to the bias line. Furthermore, in some examples, the magnitude of the mutual inductive coupling between the bias line 122 and a respective JJ is determined both by the arrangement of the bias line 122 relative to the respective JJ and the structural feature of the respective JJ.

Figure 2:
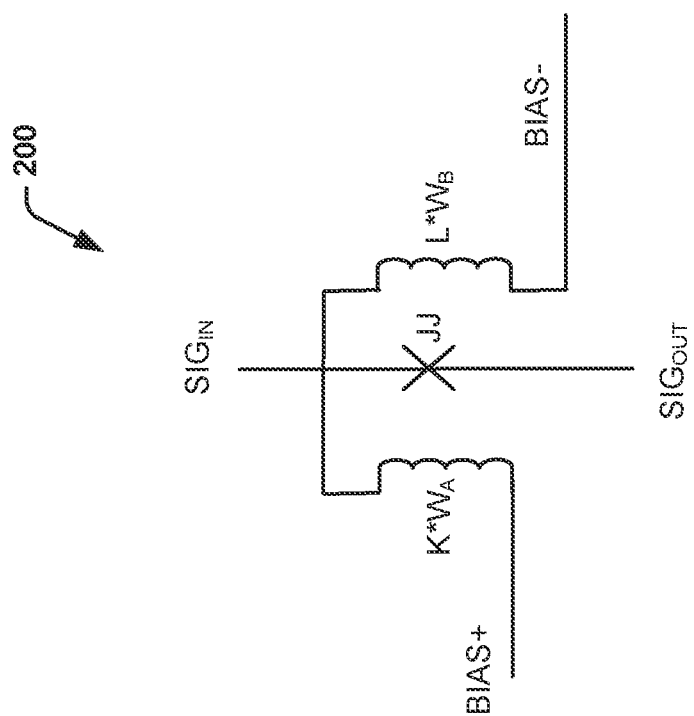
FIG. 2 illustrates a schematic diagram of an example arrangement of a bias line relative to a Josephson junction (JJ).

FIG. 2 illustrates a schematic diagram of an example arrangement 200 of a portion of a bias line relative to a Josephson junction (JJ). The arrangement 200 facilitates to achieve a mutual inductive coupling M between the bias line and the JJ. The bias line 122 in FIG. 1 may be configured to have an arrangement similar to the arrangement 200 relative to the JJ1 108 to achieve the mutual inductive coupling M1 between the bias line 122 and the JJ1 108. Similarly, bias line 122 in FIG. 1 may be configured to have an arrangement similar to the arrangement 200 relative to the JJ2 116 to achieve the mutual inductive coupling M2 between the bias line 122 and the JJ2 116. The bias line may be arranged differently relative to the JJ in other examples. The arrangement 200 is represented schematically by one or more first windings designated as K*$W_1$, where K is the number of first windings $W_1$ and K is an integer greater than or equal to one. The arrangement 200 also includes one or more second windings designated as L*$W_2$, where L is the number of second windings $W_2$ and L is an integer greater than or equal to one. In an integrated circuit structure, each of the first and second windings would span a top and bottom layer, and the JJ would be in an intermediate layer. The arrangement 200 is formed with a repetition of ends of first windings connecting with ends of second windings in a loop winding configuration that substantially surrounds the JJ. Alternatively, in other examples, one or both of the first and second windings may only need to span the top or bottom layer while still having a sufficiently high inductive coupling to the JJ.

A bias line current, applied through BIAS+ input and exiting the BIAS-output, runs through the loop winding generating a magnetic field oriented in the plane of the JJ and varies the critical current of the JJ, which in turn controls an input current that is provided at an input $SIG_{IN}$ of the JJ from flowing to an output $SIG_{OUT}$ of the JJ. When the critical current of the JJ is suppressed or becomes zero (for a certain value of the bias line current), the input current that is provided at an input $SIG_{IN}$ of the JJ is substantially reflected back from flowing at an output $SIG_{OUT}$ of the JJ. With no bias line current running through the loop winding, the JJ superconducts and the input current provided at the input $SIG_{IN}$ passes to the output $SIG_{OUT}$ without substantial reflection.

Referring back to FIG. 1, the superconducting switch system 100 furthermore includes a bias line controller 124 configured to provide a bias line current $I_B$ 134 to the bias line 122 to control the passing of a received input signal $I_{IN}$ 136 to an output of each switch network circuit of the plurality of switch network circuits. The bias line current $I_B$ 134 includes a DC signal/bias. Furthermore, the received input signal $I_{IN}$ 136 can include an AC input signal, a DC input signal, a pulsed microwave signal, etc. The bias line controller 124 is configured to control the passing of the received input signal $I_{IN}$ 136 to the output of each switch network circuit of the plurality of switch network circuits by controlling an impedance of the respective JJ of each switch network circuit of the plurality of switch network circuits. The impedance of the respective JJ of each switch network circuit of the plurality of switch network circuits is determined/controlled based on the bias line current $I_B$ 134 and the mutual inductive coupling between the bias line 122 and the respective JJ.

In particular, when a certain bias line current $I_B$ 134 is applied to the bias line 122, a certain magnetic field is generated in the plane of a JJ (e.g. the JJ1 108) depending on the mutual inductive coupling between the bias line 122 and the respective JJ, thereby varying/suppressing the critical current of the JJ, which in turn varies the impendence of the JJ. In one example, for a certain value of the bias line current $I_B$ 134, the JJ1 108 (having an associated mutual inductive coupling M1) may be in a very low impedance state or a superconducting state and the JJ2 116 (having an associated mutual inductive coupling M2) may be in a high resistive state. Depending on the different mutual inductive coupling of the JJs, the magnetic field that is generated in the plane of a JJ and the corresponding critical current varies from the other JJs, for a certain value of the bias line current $I_B$ 134, which leads to different impedances for the JJs with different mutual inductive coupling. The value of the bias line current $I_B$ 134 is selected to modify the critical current Ic of the JJ of each switch network circuit of the plurality of switch network circuits to achieve a desired value of impedance for the JJs.

Figure 3:
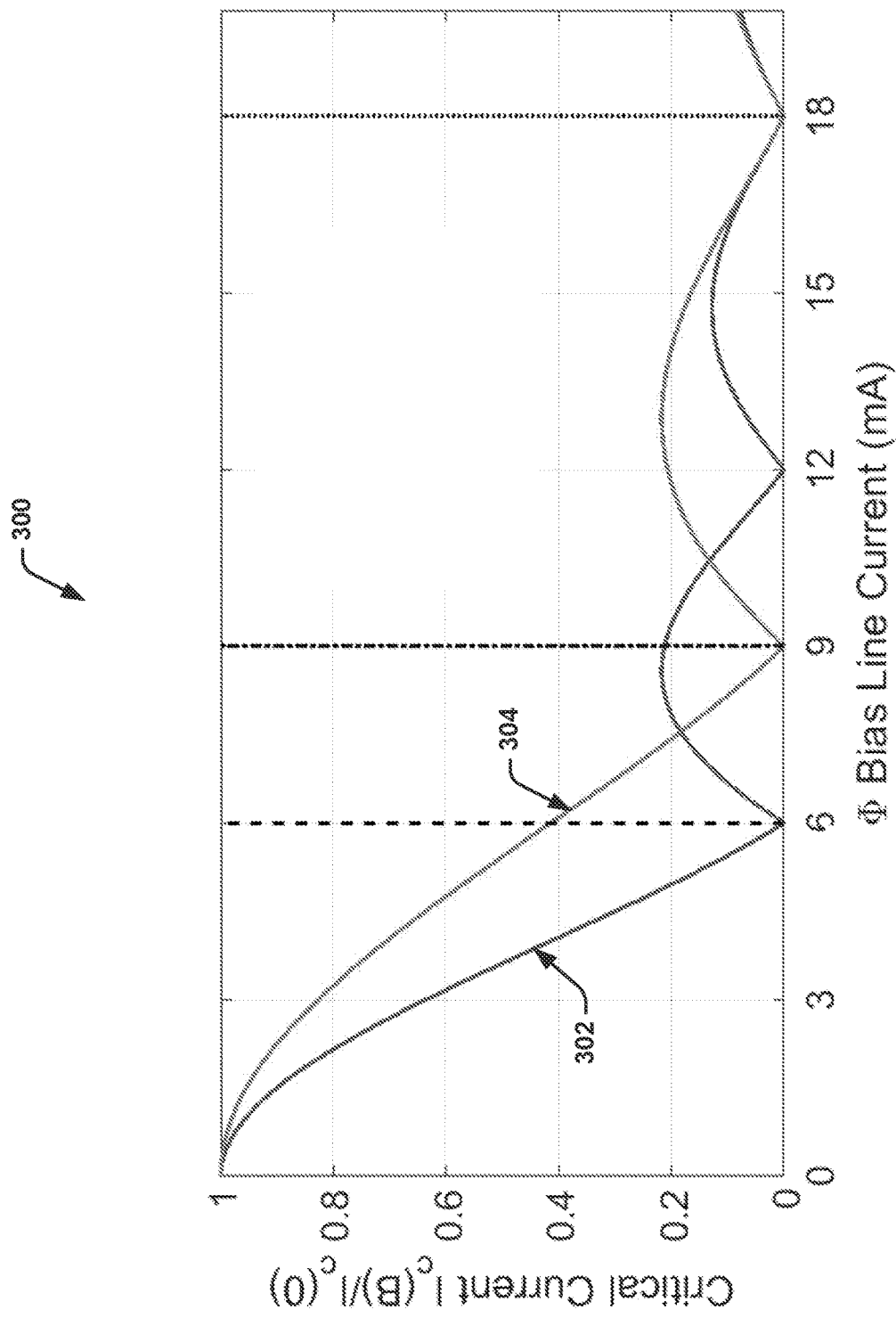
FIG. 3 illustrates an graph depicting an example variation of critical current Ic for JJ1 and JJ2 of FIG. 1 for various values of the bias line current $I_B$.

FIG. 3 illustrates a graph 300 depicting an example variation of critical current Ic for JJ1 108 and JJ2 116 of FIG. 1 for various values of the bias line current $I_B$ 134. In particular, the curve 302 depicts the variation of critical current Ic for JJ1 108 for various values of the bias line current $I_B$ 134. Furthermore, the curve 304 depicts the variation of critical current Ic for JJ2 116 for various values of the bias line current $I_B$ 134. In this example, the ratio of the mutual inductive coupling M1 for JJ1 108 and M2 for JJ2 116 is set to be 1.5 (i.e., M1/M2=1.5). However, the ratio between M1 and M2 can be set differently in other examples. When the bias line current $I_B$ 134 is set to a first bias line current of 0 mA, it can be seen that both JJ1 108 and JJ2 116 have a non-zero critical current Ic and therefore, both JJ1 108 and JJ2 116 are in a low-impedance state (or a superconducting state). When the bias line current $I_B$ 134 is set to a second bias line current of 6 mA, the critical current Ic of JJ1 108 is changed to zero while JJ2 116 has a non-zero critical current Ic. Therefore, when the bias line current $I_B$ 134 is equal to 6 mA, JJ1 108 is in a high-impedance state and the JJ2 116 is in a low-impedance state (or superconducting state).

When the bias line current $I_B$ 134 is set to a third bias line current of 9 mA, JJ1 108 has a non-zero critical current Ic while the critical current Ic of JJ2 116 is changed to zero. Therefore, when the bias line current $I_B$ 134 is equal to 9 mA, JJ1 108 is in a low-impedance state (or a superconducting state) and the JJ2 116 is in a high-impedance state. When the bias line current $I_B$ 134 is set to a fourth bias line current of 18 mA, the critical currents Ic of both JJ1 108 and JJ2 116 are changed to zero and therefore, both JJ1 108 and JJ2 116 are in a high-impedance state.

Figure 4:
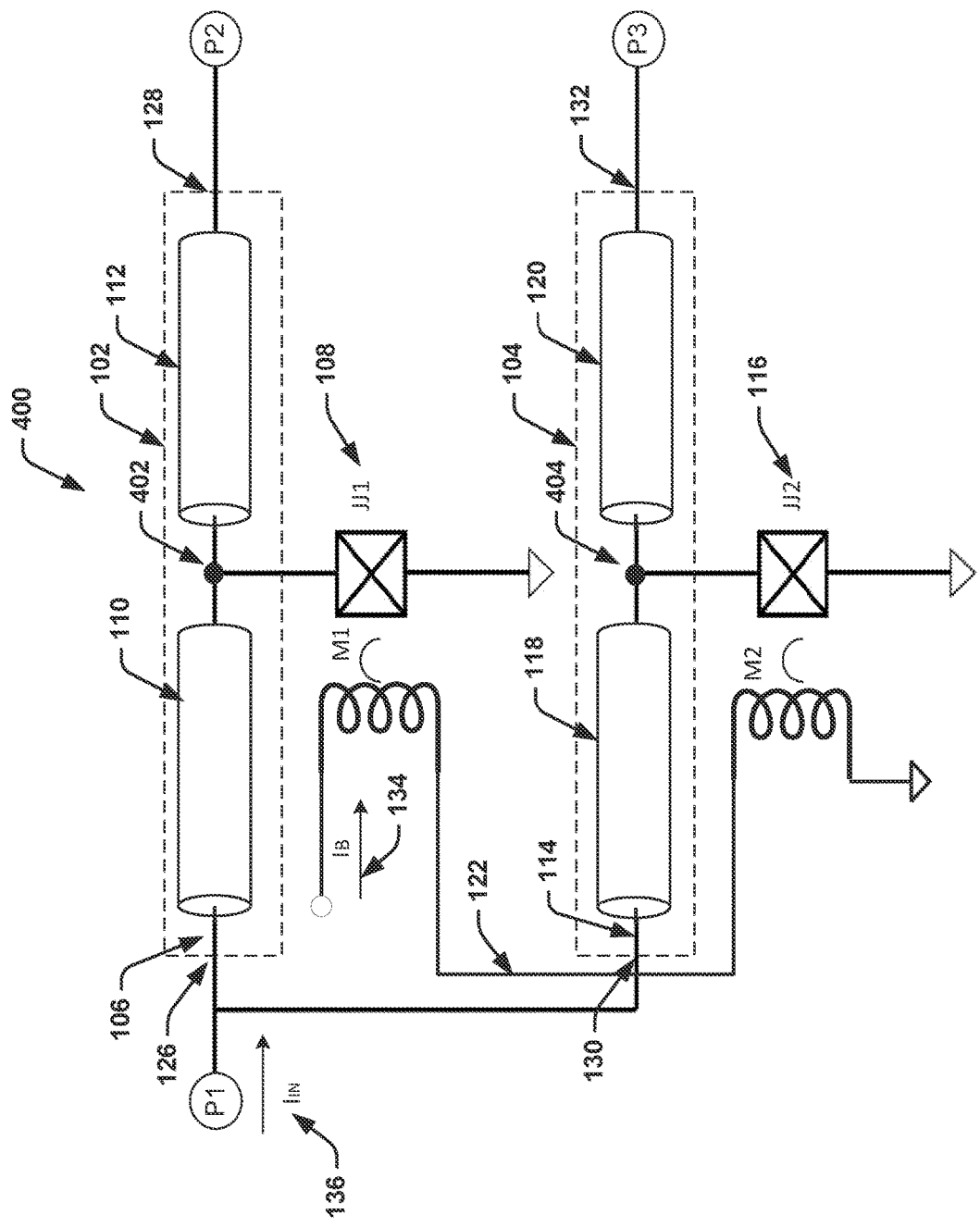
FIG. 4 illustrates a superconducting switch system that is implemented in a parallel switch network configuration.

FIG. 4 illustrates a superconducting switch system 400 that is implemented in a parallel switch network configuration. The superconducting switch system 400 includes one possible implementation of the superconducting switch system 100 in FIG. 1. The superconducting switch system 400 has the same structure as the superconducting switch system 100 of FIG. 1 and therefore, the same numbering is used herein. The bias line controller 124 (although a part of the superconducting switch system 400) is not depicted herein for simplification purposes. All the features of the superconducting switch system 100 in FIG. 1 are also applicable to the superconducting switch system 400 in FIG. 4. Furthermore, the functioning of the superconducting switch system 400 is explained herein with reference to the graph 300 in FIG. 3.

The superconducting switch system 400 includes a first switch network circuit 102 and a second switch network circuit 104. The first switch network circuit 102 includes a parallel switch network circuit with the JJ1 108 coupled to an intermediate point 402 in a first transmission line 106 at a first end and to ground at a second end. The intermediate point 402 includes a point where the first transmission portion 110 and the second transmission portion 112 of the first transmission line 106 intersect. Furthermore, the second switch network circuit 104 includes a parallel switch network circuit with the JJ2 116 coupled to an intermediate point 404 in a second transmission line 114 at a first end and to ground at a second end. The intermediate point 404 includes a point where the first transmission portion 118 and the second transmission portion 120 of the second transmission line 114 intersect. All the other features of the superconducting switch system 400 are similar to the features of the superconducting switch system 100 in FIG. 1 and are therefore not repeated herein.

When a bias line current $I_B$ 134 equal to 0 mA is provided to the bias line 122, both JJ1 108 and JJ2 116 have a non-zero critical current Ic, as can be seen in the graph 300 and therefore, both JJ1 108 and JJ2 116 are in a low-impedance state (or a superconducting state). Consequently, both JJ1 108 and JJ2 116 present a superconducting short (i.e., an impedance smaller than the transmission line impedance of the respective transmission line) to ground, thereby blocking the passing (or transmission) of the received input signal $I_{IN}$ 136 to the output 128 of the first switch network circuit 102 and to the output 132 of the second switch network circuit 104. When the bias line current $I_B$ 134 equal to 6 mA is provided to the bias line 122, the critical current Ic of JJ1 108 is changed to zero while JJ2 116 has a non-zero critical current Ic, as can be seen in the graph 300. Therefore, the JJ1 108 is in a high-impedance state and the JJ2 116 is in a low-impedance state (or superconducting state). Consequently, JJ1 108 presents a large impedance (i.e., an impedance larger than the transmission line impedance of the respective transmission line) to ground, thereby passing the received input signal $I_{IN}$ 136 to the output 128 of the first switch network circuit 102. Furthermore, JJ2 116 presents a superconducting short (i.e., an impedance smaller than the transmission line impedance of the respective transmission line) to ground, thereby blocking the passing (or transmission) of the received input signal $I_{IN}$ 136 to the output 132 of the second switch network circuit 104.

When the bias line current $I_B$ 134 equal to 9 mA is provided to the bias line 122, JJ1 108 has a non-zero critical current Ic while the critical current Ic of JJ2 116 is changed to zero, as can be seen in the graph 300. Therefore, JJ1 108 is in a low-impedance state (or a superconducting state) and the JJ2 116 is in a high-impedance state. Consequently, JJ1 108 presents a superconducting short to the ground, thereby blocking the passing (or transmission) of the received input signal $I_{IN}$ 136 to the output 128 of the first switch network circuit 102. Furthermore, JJ2 116 presents a large impedance (i.e., an impedance larger than the transmission line impedance of the respective transmission line) to the ground, thereby passing the received input signal $I_{IN}$ 136 to the output 132 of the second switch network circuit 104. When the bias line current $I_B$ 134 equal to 18 mA is provided to the bias line 122, the critical current Ic of both JJ1 108 and JJ2 116 is changed to zero, as can be seen in the graph 300 and therefore, both JJ1 108 and JJ2 116 are in a high-impedance state. Consequently, both JJ1 108 and JJ2 116 present a large impedance (i.e., an impedance larger than the transmission line impedance of the respective transmission line) to ground, thereby passing the received input signal $I_{IN}$ 136 to the output 128 of the first switch network circuit 102 and to the output 132 of the second switch network circuit 104. In this scenario, the superconducting switch system 400 functions as a power divider.

Figure 5:
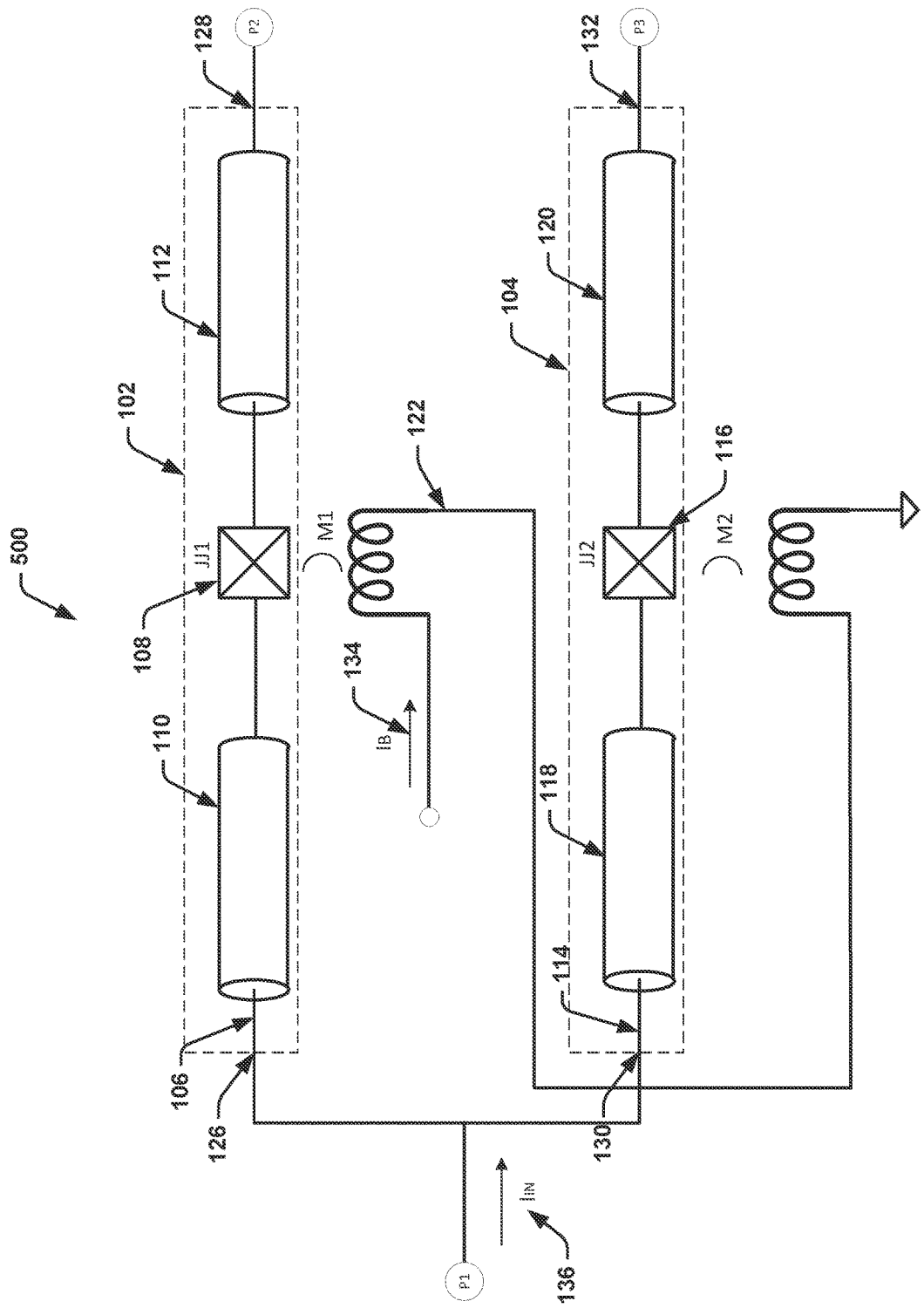
FIG. 5 illustrates a superconducting switch system that is implemented in a series switch network configuration.

FIG. 5 illustrates a superconducting switch system 500 that is implemented in a series switch network configuration. The superconducting switch system 500 includes another possible implementation of the superconducting switch system 100 in FIG. 1. The superconducting switch system 500 has the same structure as the superconducting switch system 100 of FIG. 1 and therefore, the same numbering is used herein. The bias line controller 124 (although is a part of the superconducting switch system 500) is not depicted herein for simplification purposes. All the features of the superconducting switch system 100 in FIG. 1 are also applicable to the superconducting switch system 500 in FIG. 5. Furthermore, the functioning of the superconducting switch system 500 is explained herein with reference to the graph 300 in FIG. 3.

The superconducting switch system 500 includes a first switch network circuit 102 and a second switch network circuit 104. The first switch network circuit 102 includes a series switch network circuit having a first end of the JJ1 108 coupled to the first transmission line portion 110 of the first transmission line 106 at the end opposite to the input 126 and having a second end of the JJ1 108 coupled to the second transmission line portion 112 of the first transmission line 106 at the end opposite to the output 128. The second switch network circuit 104 includes a series switch network circuit having a first end of the JJ2 116 coupled to the first transmission line portion 118 of the second transmission line 114 at the end opposite to the input 130 and having a second end of the JJ2 116 coupled to the second transmission line portion 120 of the second transmission line 114 at the end opposite to the output 132. All the other features of the superconducting switch system 500 are similar to the features of the superconducting switch system 100 in FIG. 1 and is therefore not repeated herein.

When a bias line current $I_B$ 134 equal to 0 mA is provided to the bias line 122, both JJ1 108 and JJ2 116 have a non-zero critical current Ic, as can be seen in the graph 300 and therefore, both JJ1 108 and JJ2 116 are in a low-impedance state (or a superconducting state). Consequently, both JJ1 108 and JJ2 116 super conduct and consequently will pass the received input signal $I_{IN}$ 136 to the output 128 of the first switch network circuit 102 and to the output 132 of the second switch network circuit 104. In this scenario, the superconducting switch system 500 acts as a power divider. When the bias line current $I_B$ 134 equal to 6 mA is provided to the bias line 122, the critical current Ic of JJ1 108 is changed to zero while JJ2 116 has a non-zero critical current Ic, as can be seen in the graph 300. Therefore, the JJ1 108 is in a high-impedance state and the JJ2 116 is in a low-impedance state (or superconducting state). Consequently, JJ1 108 presents a large impedance (i.e., an impedance larger than the transmission line impedance of the respective transmission line), thereby blocking the received input signal $I_{IN}$ 136 from passing to the output 128 of the first switch network circuit 102. Furthermore, JJ2 116 superconducts, and consequently will pass the received input signal $I_{IN}$ 136 to the output 132 of the second switch network circuit 104.

When the bias line current $I_B$ 134 equal to 9 mA is provided to the bias line 122, JJ1 108 has a non-zero critical current Ic while the critical current Ic of JJ2 116 is changed to zero, as can be seen in the graph 300. Therefore, JJ1 108 is in a low-impedance state (or a superconducting state) and the JJ2 116 is in a high-impedance state. Consequently, JJ1 108 superconducts, and consequently will pass the received input signal $I_{IN}$ 136 to the output 128 of the first switch network circuit 102. Furthermore, JJ2 116 presents a large impedance (i.e., an impedance larger than the transmission line impedance of the respective transmission line), thereby blocking the received input signal $I_{IN}$ 136 from passing to the output 132 of the second switch network circuit 104. When the bias line current $I_B$ 134 equal to 18 mA is provided to the bias line 122, the critical current Ic of both JJ1 108 and JJ2 116 is changed to zero, as can be seen in the graph 300 and therefore, both JJ1 108 and JJ2 116 are in a high-impedance state. Consequently, both JJ1 108 and JJ2 116 present a large impedance (i.e., an impedance larger than the transmission line impedance of the respective transmission line), thereby blocking the received input signal $I_{IN}$ 136 from passing to the output 128 of the first switch network circuit 102 and to the output 132 of the second switch network circuit 104.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting switch system comprising:
    a plurality of switch network circuits, each switch network circuit having a respective Josephson junction (JJ) coupled to a respective transmission line; and
    a bias line inductively coupled to the respective JJ of each switch network circuit of the plurality of switch network circuits, such that a mutual inductive coupling between the bias line and the respective JJ of at least two switch network circuits of the plurality of switch network circuits are different from one another;
    wherein a bias line current to the bias line controls the passing or blocking of a received input signal to an output for each of the plurality of switch network circuits by controlling the impedance of the respective JJ of each switch network circuit of the plurality of switch network circuits, wherein the impedance of the respective JJ of each switch network circuit of the plurality of switch network circuits is determined based on the bias line current and the mutual inductive coupling between the bias line and the respective JJ.

2. The system of claim 1, wherein the mutual inductive coupling between the bias line and the respective JJ is determined by an arrangement of the bias line around the respective JJ, or by a structural feature of the respective JJ, or both.

3. The system of claim 1, wherein when the bias line current is set to a first amplitude and a first polarity, a critical current of the respective JJ of a first switch network circuit of the at least two switch network circuits is modified to zero and wherein when the bias line current is set to a second amplitude and a second polarity, the critical current of the respective JJ of the first switch network circuit of the at least two switch network circuits is modified a non-zero value, wherein the first amplitude is different from the second amplitude and wherein the first polarity and the second polarity are the same.

4. The system of claim 1, wherein each of the respective transmission lines has a first transmission line portion coupled to an input of the respective switch network circuit and a second transmission line portion coupled to an output of the respective switch network circuit, wherein the respective JJ is coupled between an end of the first transmission line portion opposite the input and an end of the second transmission line portion opposite the output.

5. The system of claim 4, wherein each switch network circuit of the plurality of switch network circuits comprises a parallel switch network circuit having the respective JJ coupled to an intermediate point in a respective transmission line at a first end and to ground at a second end.

6. The system of claim 5, wherein, responsive to providing the bias line current comprising a first bias line current, the respective JJ of a first switch network circuit of the at least two switch network circuits and the respective JJ of a second switch network circuit of the at least two switch network circuits presents a superconducting short to ground, thereby blocking the received input signal from passing to the outputs of the first switch network circuit and the second switch network circuit.

7. The system of claim 6, wherein, responsive to providing the bias line current comprising a second bias line current, the respective JJ of the first switch network circuit of the at least two switch network circuits presents a large impedance to the ground, thereby passing the received input signal to the output of the first switch network circuit and the respective JJ of the second switch network circuit of the at least two switch network circuits presents a superconducting short to the ground, thereby blocking the received input signal from passing to the output of the second switch network circuit.

8. The system of claim 7, wherein, responsive to providing the bias line current comprising a third bias line current, the respective JJ of the first switch network circuit of the at least two switch network circuits presents a superconducting short to the ground, thereby blocking the received input signal from passing to the output of the first switch network circuit and the respective JJ of the second switch network circuit of the at least two switch network circuits presents a large impedance to the ground, thereby passing the received input signal to the output of the second switch network circuit.

9. The system of claim 8, wherein, responsive to providing the bias line current comprising a fourth bias line current, the respective JJ of the first switch network circuit of the at least two switch network circuits and the respective JJ of the second switch network circuit of the at least two switch network circuits present a large impedance to the ground, thereby passing the received input signal to the outputs of the first switch network circuit and the second switch network circuit.

10. The system of claim 4, wherein each switch network circuit of the plurality of switch network circuits comprises a series switch network circuit having a first end of the respective JJ coupled to the first transmission line portion of the respective transmission line at the end opposite to the input and a second end of the respective JJ coupled to the second transmission line portion of the respective transmission line at the end opposite to the output.

11. The system of claim 10, wherein, responsive to providing the bias line current comprising a first bias line current, the respective JJ of a first switch network circuit of the at least two switch network circuits and the respective JJ of a second switch network circuit of the at least two switch network circuits superconducts, thereby passing the received input signal to the outputs of the first switch network circuit and the second switch network circuit.

12. The system of claim 11, wherein, responsive to providing the bias line current comprising a second bias line current, the respective JJ of the first switch network circuit of the at least two switch network circuits presents a large impedance, thereby blocking the received input signal from passing to the output of the first switch network circuit and the respective JJ of the second network of the at least two switch network circuits superconducts, thereby passing the received input signal to the output of the second switch network circuit.

13. The system of claim 12, wherein, responsive to providing the bias line current comprising a third bias line current, the respective JJ of the first switch network circuit of the at least two switch network circuits superconducts, thereby passing the received input signal to the output of the first switch network circuit and the respective JJ of a second switch network circuit of the at least two switch network circuits presents a large impedance, thereby blocking the received input signal from passing to the output of the second switch network circuit.

14. The system of claim 13, wherein, responsive to providing the bias line current comprising a fourth bias line current, the respective JJ of the first switch network circuit of the at least two switch network circuits and the respective JJ of the second switch network circuit of the at least two switch network circuits presents a large impedance, thereby blocking the received input signal from passing to the outputs of the first switch network circuit and the second switch network circuit.

15. The system of claim 1, wherein an input of each switch network circuit of the plurality of switch network circuits are connected to a same input port and the output of each switch network circuit of the plurality of switch network circuits are coupled to a respective dedicated output port.

16. A superconducting switch system comprising:
a first switch network circuit having a first Josephson junction (JJ) coupled to a first transmission line;
a second switch network circuit having a second JJ coupled to a second transmission line;
a bias line inductively coupled to first JJ and the second JJ, such that a first mutual inductive coupling between the bias line and the first JJ is different from a second mutual inductive coupling between the bias line and the second JJ; and
a bias line controller configured to provide a bias line current to the bias line to control the passing of a received input signal to outputs of the first switch network circuit and the second switch network circuit based on controlling an impedance of the first JJ and an impedance of the second JJ, wherein the impedance of the first JJ is determined based on the bias line current and the first mutual inductive coupling, and the impedance of the second JJ is determined based on the bias line current and the second mutual inductive coupling.

17. The system of claim 16, wherein the first mutual inductive coupling between the bias line and the first JJ is determined by an arrangement of the bias line around the first JJ, or by a structural feature of the first JJ, or both, and the second mutual inductive coupling between the bias line and the second JJ is determined by an arrangement of the bias line around the second JJ, or by a structural feature of the second JJ, or both.

18. The system of claim 16, wherein when the bias line current is set to a first amplitude and a first polarity, a critical current of the respective JJ of a first switch network circuit of the at least two switch network circuits is modified to zero and wherein when the bias line current is set to a second amplitude and a second polarity, the critical current of the respective JJ of the first switch network circuit of the at least two switch network circuits is modified a non-zero value, wherein the first amplitude is different from the second amplitude and wherein the first polarity and the second polarity are the same.

19. The system of claim 16, wherein both the first switch network circuit and the second switch network comprise a parallel switch network circuit, the first switch network circuit having the first JJ coupled to an intermediate point in the first transmission line at a first end and to ground at a second end, and the second switch network circuit having the second JJ coupled to an intermediate point in the second transmission line at a first end and to ground at a second end.

20. The system of claim 16, wherein both the first switch network circuit and the second switch network circuit comprise a series switch network circuit, the first switch network circuit having a first end of the first JJ coupled to a first transmission line portion of the first transmission line and a second end of the first JJ coupled to a second transmission line portion of the first transmission line, and the second switch network circuit having a first end of the second JJ coupled to a first transmission line portion of the second transmission line and a second end of the second JJ coupled to a second transmission line portion of the second transmission line.

* * * * *